(12) United States Patent
Tsuruoka

(10) Patent No.: US 9,660,007 B2
(45) Date of Patent: May 23, 2017

(54) DISPLAY DEVICE AND METHOD OF MANUFACTURING DISPLAY DEVICE

(71) Applicant: Japan Display Inc., Tokyo (JP)

(72) Inventor: Kazuto Tsuruoka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/499,481

(22) Filed: Sep. 29, 2014

(65) Prior Publication Data

US 2015/0090990 A1  Apr. 2, 2015

(30) Foreign Application Priority Data

Oct. 2, 2013  (JP) .................................. 2013-207137

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 27/32* | (2006.01) | |

(52) U.S. Cl.
CPC ...... *H01L 27/3255* (2013.01); *H01L 51/0097* (2013.01); *H01L 2224/16225* (2013.01); *H01L 2224/32225* (2013.01); *H01L 2224/73204* (2013.01)

(58) Field of Classification Search
CPC .......... H01L 27/1266; H01L 2227/326; H01L 2251/5338; H01L 27/1214; H01L 27/3244; H01L 51/5237; H01L 27/3288; H01L 29/78603; H01L 51/5253; H01L 2221/68368; H01L 27/3276; H01L 51/003; H01L 51/5256; H01L 51/56; H01L 27/3251; H01L 51/5246

USPC ......... 257/40, E27.111, E33.001, 59, 83, 79; 438/149, 21, 23, 24, 28, 30, 34

See application file for complete search history.

(56) References Cited

U.S. PATENT DOCUMENTS

| | | | | |
|---|---|---|---|---|
| 6,542,374 B1* | 4/2003 | Muramatsu | .......... | H05K 1/0274 257/669 |
| 7,636,145 B2* | 12/2009 | Jung | ................... | G02F 1/13458 349/149 |
| 2007/0076393 A1* | 4/2007 | Jeong | ..................... | H05K 1/111 361/767 |
| 2007/0181246 A1* | 8/2007 | Yamashita | ........ | G02F 1/133305 156/235 |

(Continued)

FOREIGN PATENT DOCUMENTS

JP             3850915 B     9/2006

*Primary Examiner* — Thao X Le
*Assistant Examiner* — Nduka Ojeh
(74) *Attorney, Agent, or Firm* — Typha IP LLC

(57) ABSTRACT

A display device according to the invention includes: a first substrate that includes a flexible substrate, is segmented into a display area and a non-display area outside the display area, and includes a thin film transistor and an electroluminescent light-emitting element formed on the display area of the flexible substrate; and an IC chip that is bonded on the non-display area of the first substrate via an anisotropic conductive film, wherein the first substrate includes, between the flexible substrate and the anisotropic conductive film, at least one or more support layers whose plan view shape is larger than that of the IC chip and whose hardness is higher than that of the flexible substrate, and the IC chip is located inside the at least one or more support layers in a plan view.

8 Claims, 12 Drawing Sheets

(56) References Cited

U.S. PATENT DOCUMENTS

| | | | |
|---|---|---|---|
| 2009/0059155 A1* | 3/2009 | Nakayama | G02F 1/13394 349/156 |
| 2009/0227074 A1* | 9/2009 | Hong | G02F 1/133305 438/149 |
| 2009/0261355 A1* | 10/2009 | Matsukizono | H01L 29/06 257/88 |
| 2011/0147747 A1* | 6/2011 | Jeon | H01L 27/1218 257/59 |

* cited by examiner

DISPLAY DEVICE AND METHOD OF MANUFACTURING DISPLAY DEVICE

CROSS-REFERENCE TO RELATED APPLICATION

The present application claims priority from Japanese application JP 2013-207137 filed on Oct. 2, 2013, the content of which is hereby incorporated by reference into this application.

BACKGROUND OF THE INVENTION

1. Field of the Invention

The present invention relates to a display device and a method of manufacturing a display device.

2. Description of the Prior Art

In recent years, flexible display devices including a bendable substrate have been developed. As a substrate of the display device, a TFT (thin film transistor) substrate including thin film transistors formed on a flexible resin substrate, or a color filter substrate including color filters formed on a resin substrate is used. In the TFT substrate, circuits are formed in a display area of the TFT substrate, while terminals to connect an external connection apparatus with the circuits are formed in a non-display area outside the display area.

As the TFT substrate of the display device, the publication of Japanese Patent No. 3850915 discloses a technology for a TFT substrate including a polyimide film on which an IC chip is mounted has been disclosed. The TFT substrate is flexible, and solder is formed along the perimeter of a circuit component mounted on the polyimide film.

SUMMARY OF THE INVENTION

In general, a method of manufacturing the TFT substrate in the display device includes a step of sequentially forming a flexible resin substrate and a thin film transistor on a glass substrate, a step of pressure bonding an IC chip on the resin substrate via an anisotropic conductive film, and a step of separating the resin substrate from the glass substrate.

The hardness of the resin substrate is lower than that of the glass substrate. Therefore, in the manufacturing method, pressure acting from the IC chip on the anisotropic conductive film is absorbed by the resin substrate when pressure bonding the IC chip on the resin substrate. For this reason, there is a risk that electrical conduction between the IC chip and the thin film transistor via the anisotropic conductive film may become unstable.

The invention has been made in view of the circumstances described above, and it is an object of the invention to realize an improvement in the reliability of a display device.

(1) A display device according to an aspect of the invention includes: a first substrate that includes a flexible substrate, is segmented into a display area and a non-display area outside the display area, and includes a thin film transistor and a display element formed on the display area of the flexible substrate; a second substrate that is arranged so as to face an upper surface of the display area of the first substrate; and an IC chip that is bonded on the non-display area of the first substrate, wherein the first substrate includes, between the flexible substrate and the IC chip, at least one or more support layers whose plan view shape is larger than that of the IC chip and whose hardness is higher than that of the flexible substrate, and the IC chip is located inside an area where the at least one or more support layers are provided in a plan view.

(2) According to the display device according to the aspect of the invention, in (1), the at least one or more support layers may be located outside the display area in the plan view.

(3) According to the display device according to the aspect of the invention, in (1), one of the at least one or more support layers may be a metal support layer formed of metal.

(4) According to the display device according to the aspect of the invention, in (3), the metal support layer may be formed in the same layer as a wiring of the thin film transistor.

(5) According to the display device according to the aspect of the invention, in (1), one of the at least one or more support layers may be an insulating support layer formed of an insulating material.

(6) According to the display device according to the aspect of the invention, in (1), one of the at least one or more support layers may be formed of polysilicon.

(7) According to the display device according to the aspect of the invention, in (1), the at least one or more support layers may include an insulating support layer formed of an insulating material and a metal support layer formed of metal, the insulating support layer may be formed closer to the side of the flexible substrate than the metal support layer, and an insulating film may be formed between the insulating support layer and the metal support layer.

(8) According to the display device according to the aspect of the invention, in (7), the insulating film formed in the same layer as a gate insulating film of the thin film transistor.

(9) A method of manufacturing a display device according to another aspect of the invention includes the steps of: forming, on a basic substrate, a flexible substrate that is segmented into a display area and a non-display area outside the display area; forming, on the flexible substrate, at least one or more support layers whose hardness is higher than that of the flexible substrate; forming, on the display area of the flexible substrate, a thin film transistor and a display element; arranging a counter substrate so as to face the display area; bonding, on the non-display area of the at least one or more support layers, an IC chip whose plan view shape is smaller than that of the at least one or more support layers so as to be located inside an area where the at least one or more support layers are provided in a plan view; and separating the flexible substrate from the basic substrate.

(10) According to the method of manufacturing a display device according to the aspect of the invention, in (9), in the step of forming the at least one or more support layers, the at least one or more support layers may be formed so as to be located outside the display area in the plan view.

(11) According to the method of manufacturing a display device according to the aspect of the invention, in (9), a metal support layer as one of the at least one or more support layers may be formed of metal.

(12) According to the method of manufacturing a display device according to the aspect of the invention, in (11), the metal support layer may be formed in the same layer as a wiring of the thin film transistor.

(13) According to the method of manufacturing a display device according to the aspect of the invention, in (9), an insulating support layer as one of the at least one or more support layers may be formed of polysilicon.

(14) According to the method of manufacturing a display device according to the aspect of the invention, in (9), the at least one or more support layers may include an insulating support layer formed of an insulating material and a metal support layer formed of metal, the insulating support layer may be formed closer to the side of the flexible substrate than the metal support layer, and an insulating film may be formed between the insulating support layer and the metal support layer.

DETAILED DESCRIPTION OF THE INVENTION

Figure 1:
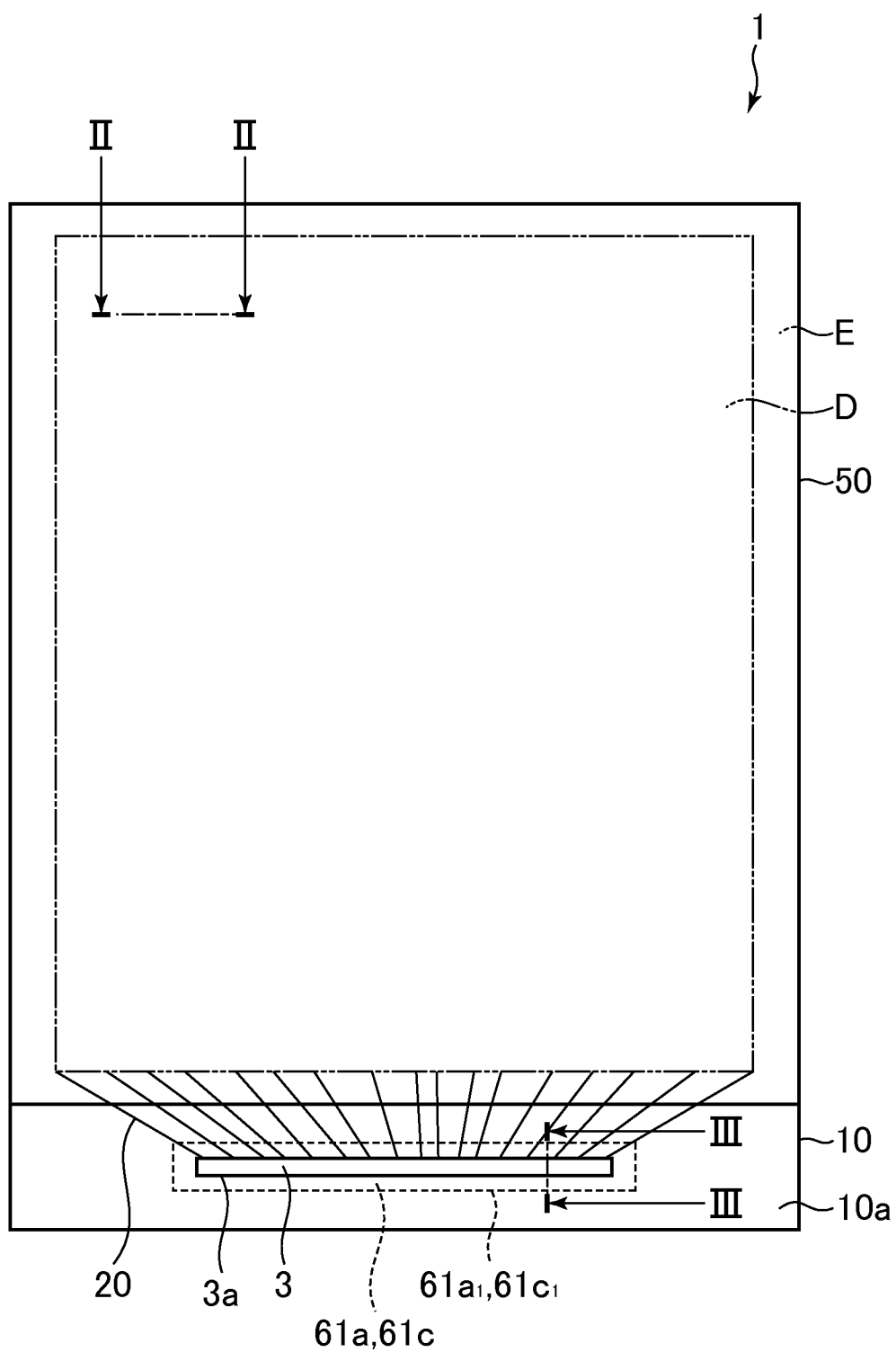
FIG. 1 is a schematic plan view of a display device according to an embodiment of the invention.

Hereinafter, a display device according to an embodiment of the invention will be described using a display device 1 as an example based on the drawings. In the drawings referred to in the following description, a feature portion is shown in an enlarged manner in some cases for convenience sake for easy understanding of the feature. Therefore, the dimension ratio or the like of each component is not always the same as the actual component. Moreover, a material or the like illustrated in the following description is shown by way of example. Therefore, each component may be formed of a different material or the like from the illustrated one, and the invention can be implemented by changing the material or the like within a range not changing the gist of the invention.

Figure 2:
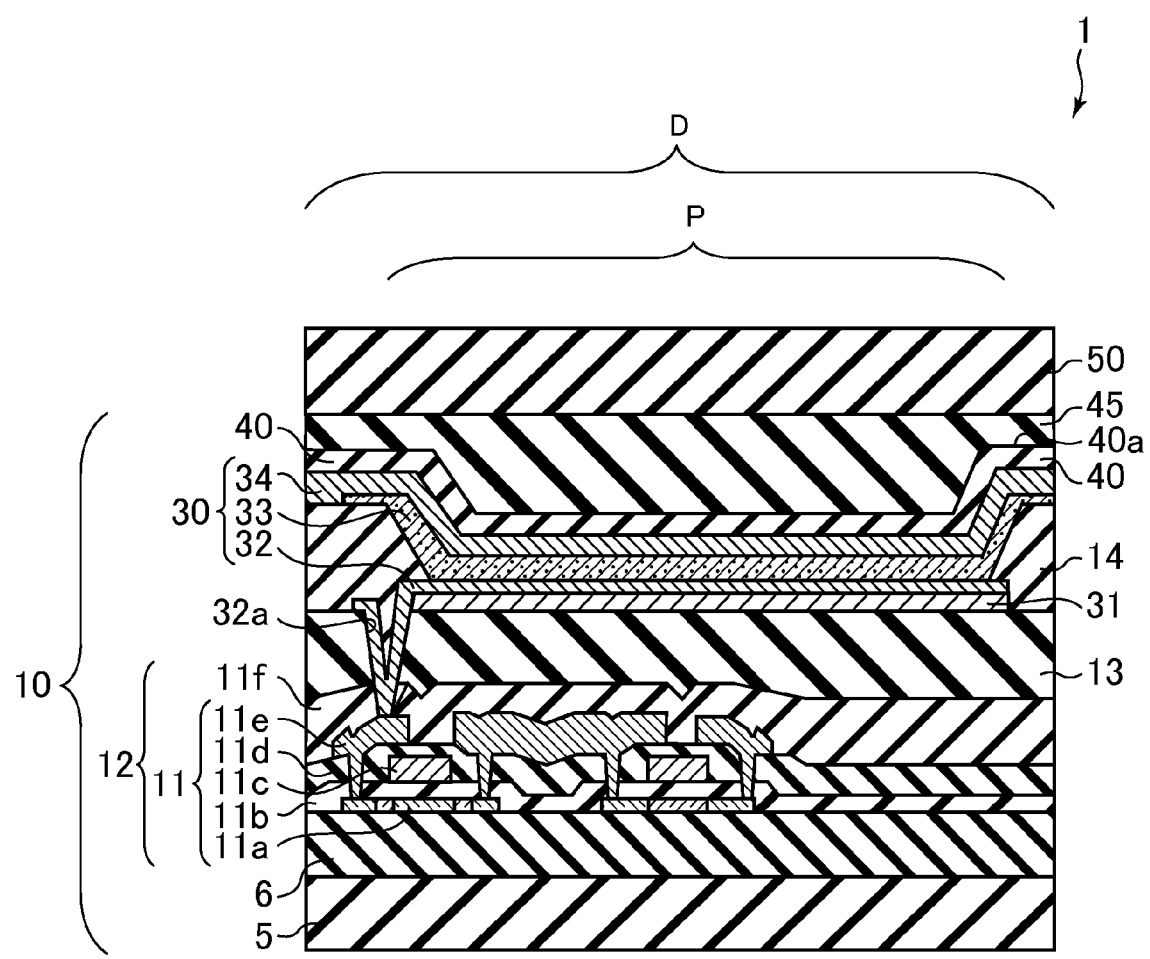
FIG. 2 is a schematic cross-sectional view of the display device shown in FIG. 1 along the cut line II-II.

FIG. 1 is a schematic plan view of the display device 1 according to the embodiment of the invention. FIG. 2 is a schematic cross-sectional view of the display device 1 shown in FIG. 1 along the cut line II-II. The display device 1 includes a first substrate 10 in which thin film transistors 11 are formed, a second substrate 50 arranged to face a display area D of the first substrate 10, and an IC chip (Integrated Circuit) 3 arranged on a non-display area E of the first substrate 10.

The first substrate 10 is a member on which the second substrate 50 is arranged to face an upper surface 10a of the display area D of the first substrate 10. The first substrate 10 is segmented into the display area D and the non-display area E outside the display area D. In the display area D, an undercoat layer 6, a circuit layer 12 including the thin film transistors 11, a planarization film 13, organic electroluminescent light-emitting elements 30 as display elements, and a sealing film 40 are stacked on a flexible substrate 5 formed of, for example, resin.

The flexible substrate 5 is a flexible substrate that functions as a base material of the first substrate 10. The flexible substrate is formed of resin such as, for example, polyimide. However, the flexible substrate may be formed of other materials as long as the material has flexibility to allow the first substrate 10 to bend.

An upper surface of the flexible substrate 5 may be covered with the undercoat layer 6. The undercoat layer 6 is a layer formed of an insulating material to maintain insulation between the flexible substrate 5 and the thin film transistors 11. The undercoat layer 6 is formed of, for example, $SiO_2$, but may be formed of other materials or may have a configuration of two or more layers stacked on each other.

The circuit layer 12 is a layer in which the thin film transistors 11, a passivation film 11f, and electric wirings (not shown) are formed. The circuit layer 12 is formed to drive the organic electroluminescent light-emitting elements 30.

The thin film transistor 11 is provided in each of pixels P on the flexible substrate 5. Specifically, for example, the thin film transistor 11 is composed of a polysilicon semiconductor layer 11a, a gate insulating layer (first insulating film) 11b, a gate electrode (wiring) 11c formed of, for example, MoW (molybdenum tungsten), a second insulating film 11d, and a source-drain electrode 11e formed of, for example, Al (aluminum). The material of the gate electrode 11c or the source-drain electrode 11e is not limited to the example described above, and other metal materials or alloys may be used.

Moreover, the thin film transistor 11 is covered with the passivation film (third insulating film) 11f. The passivation film 11f is formed to protect the thin film transistor 11 and maintain insulation between the thin film transistor 11 and the organic electroluminescent light-emitting element 30.

The planarization film 13 is a layer formed of an insulating material such as, for example, $SiO_2$, SiN, acrylic resin, or polyimide, and is formed so as to cover the circuit layer 12. Since the planarization film 13 is formed between the flexible substrate 5 and the organic electroluminescent light-emitting elements 30, the thin film transistors 11 adjacent to each other or the thin film transistor 11 and the organic electroluminescent light-emitting element 30 are electrically insulated from each other.

Moreover, contact holes 32a each of which electrically connects the thin film transistor 11 with the organic electroluminescent light-emitting element 30 are formed in the planarization film 13.

A reflection film 31 may be formed in an area corresponding to each of the pixels P on the planarization film 13. The reflection film 31 is a film to reflect light emitted from the organic electroluminescent light-emitting element 30 toward the second substrate 50 side. The reflection film preferably has a higher optical reflectance, and a metal film formed of, for example, aluminum or silver (Ag) is used as the material of the reflection film.

The plurality of organic electroluminescent light-emitting elements 30 are formed on the planarization film 13 via, for example, the reflection film 31. The plurality of organic electroluminescent light-emitting elements 30 are provided in a matrix according to the pixels P in an area corresponding to the display area D above the flexible substrate 5.

The organic electroluminescent light-emitting element 30 includes an anode 32, an organic layer 33 including at least a light-emitting layer, and a cathode 34 formed so as to cover the organic layer 33, thereby functioning as a light-emitting source.

The anode 32 is an electrode to inject a drive current into the organic layer 33. The anode 32 is connected to the contact hole 32a and thus electrically connected to the thin film transistor 11, so that a drive current is supplied from the thin film transistor 11.

The anode 32 is formed of a conductive material. Specifically, for example, the material of the anode 32 is preferably ITO (Indium Tin Oxide), but may be a light-transmissive and conductive material such as IZO (indium-zinc composite oxide), tin oxide, zinc oxide, indium oxide, or aluminum oxide composite oxide. When the reflection film 31 is formed of metal such as silver and in contact with the anode 32, the reflection film functions as a portion of the anode 32.

A pixel separation film 14 is formed along each border between the pixels P adjacent to each other between the anodes 32 adjacent to each other. The pixel separation film 14 has functions of preventing contact between the anodes 32 adjacent to each other and leakage current between the anode 32 and the cathode 34. The pixel separation film 14 is formed of an insulating material. Specifically, for example, the pixel separation film 14 is formed of a photosensitive resin composition.

The organic layer 33 is a layer formed of an organic material and including at least a light-emitting layer, and is formed so as to cover the anode 32. The organic layer 33 is not limited to the configuration in which the organic layer is formed for each of the anodes 32, but may be formed so as to cover the entire surface of an area where the pixels P are arranged in the display area D. The organic layer 33 includes a light-emitting layer that emits light. The emitted light may be white or have other colors.

The organic layer 33 includes, for example, a hole injection layer, a hole transport layer, a light-emitting layer, an electron transport layer, and an electron injection layer (all not shown) stacked in this order from the anode 32 side. The stacked structure of the organic layer 33 is not limited to that described herein, and the stacked structure is not specified as long as the stacked structure includes at least a light-emitting layer.

The light-emitting layer is composed of, for example, an organic electroluminescent substance that emits light in response to the combination of holes and electrons. As such an organic electroluminescent substance, for example, a substance used generally as an organic light-emitting material may be used.

The cathode 34 is formed so as to cover the organic layer 33. The cathode 34 is not limited to the configuration in which the cathode is formed in each of the pixels P, but may be formed so as to cover the entire surface of the area where the pixels P are arranged in the display area D. With the configuration described above, the cathode 34 is in common contact with the organic layers 33 of the plurality of organic electroluminescent light-emitting elements 30.

The cathode 34 is formed of a light-transmissive and conductive material. Specifically, for example, the material of the cathode 34 is preferably ITO, but may be a material obtained by mixing metal such as silver or magnesium into a conductive metal oxide such as ITO or InZnO, or by stacking a metal thin film such as of silver or magnesium and a conductive metal oxide on each other.

The organic electroluminescent light-emitting elements 30 (the cathode 34) are covered with the sealing film 40 over the plurality of pixels P. The sealing film 40 is a transparent film formed of an insulating material that covers the entire first substrate 10 to thereby prevent the penetration of oxygen or moisture into the layers including the organic layer 33.

The upper surface of the first substrate 10 (an upper surface 40a of the sealing film 40) is covered with the second substrate 50 via a filler 45 formed of, for example, an inorganic material. The second substrate 50 is, for example, a substrate having a perimeter smaller than that of the first substrate 10 in a plan view, and is arranged so as to face the display area D of the first substrate 10. Specifically, for example, a color filter substrate can be used as the second substrate 50 when the light-emitting layer of the organic layer 33 emits white light. With the use of a color filter substrate as the second substrate 50, the display device 1 can perform color display.

Figure 3:
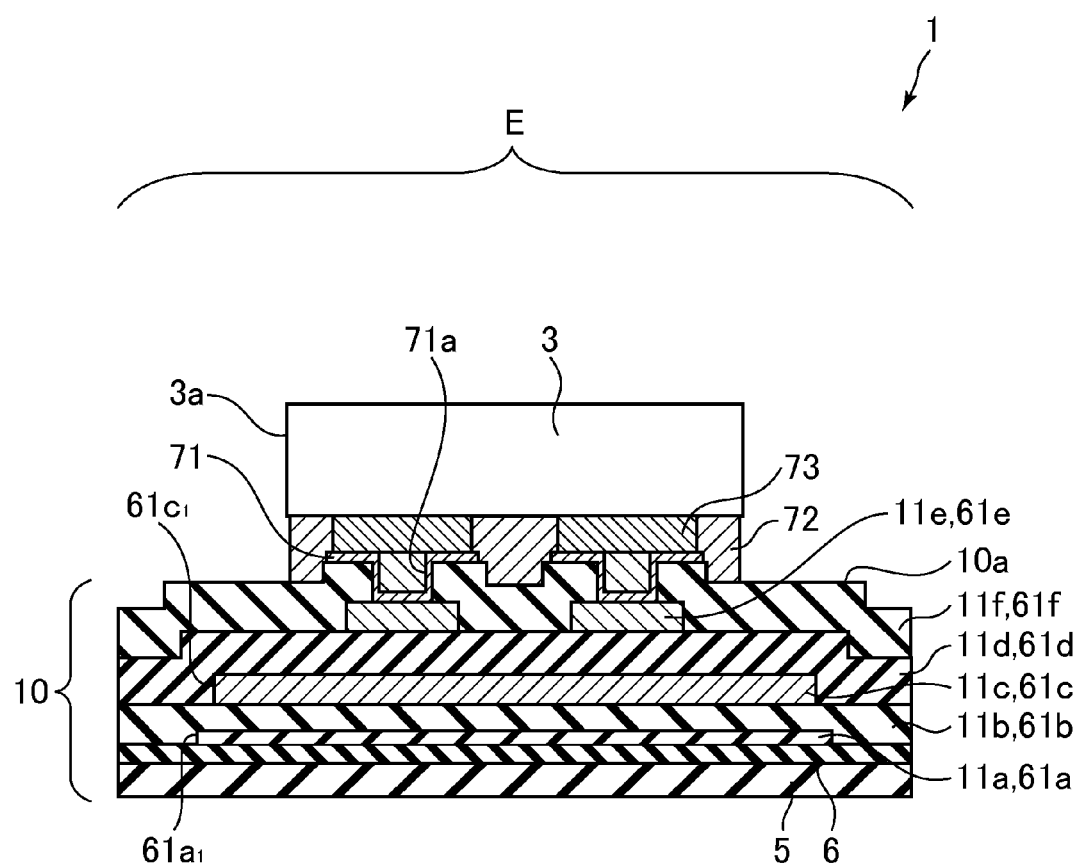
FIG. 3 is a schematic cross-sectional view of the display device shown in FIG. 1 along the cut line III-III.

Next, with reference to FIGS. 1 and 3, the IC chip 3 arranged on the non-display area E of the first substrate 10 and the surrounding configuration of the IC chip 3 will be described in detail. FIG. 3 is a schematic cross-sectional view of the display device 1 shown in FIG. 1 along the cut line III-III.

The IC chip 3 is an IC (Integrated Circuit) that is arranged on the first substrate 10 and supplied with image data from the outside of the display device 1 via an external apparatus (not shown). As shown in FIG. 1, the IC chip 3 is provided in an area where the second substrate 50 is not arranged on the upper surface 10a of the first substrate 10. Moreover, the IC chip 3 is connected to the thin film transistors 11 in the display area D through first wirings 20 formed in the non-display area E.

As shown in FIG. 3, the IC chip 3 includes terminals 73 connected to the first substrate 10. The terminal 73 is formed of, for example, metal, and pressure bonded via an anisotropic conductive film 72 to a terminal electrode 71 formed on the upper surface 10a of the first substrate 10.

In the anisotropic conductive film 72, conductive particles (not shown) are contained. Since pressure to the first substrate 10 side is applied from the terminal 73 of the IC chip 3 to the anisotropic conductive film 72, a conductive path is formed on surfaces of the conductive particles to provide electrical conduction between the terminal 73 and the terminal electrode 71.

Next, the configuration of an area of the first substrate 10 corresponding to the area where the IC chip 3 is arranged will be described in detail. As shown in FIG. 3, the area of the first substrate 10 includes: for example, the flexible substrate 5; the undercoat layer 6, an insulating support layer 61a, a first insulating film 61b, a metal support layer 61c, a second insulating film 61d, second wirings 61e, and a third insulating film 61f that are stacked in this order on the flexible substrate 5; and the terminal electrodes 71. The configurations of the flexible substrate 5 and the undercoat layer 6 are the same as those of the first substrate 10 in the display area D. Therefore, the configurations of the insulating support layer 61a to the terminal electrode 71 will be described in detail below.

The insulating support layer 61a is a support layer whose hardness is higher than that of the flexible substrate 5, for preventing the stress of the IC chip 3 from acting on the first substrate 10 around the IC chip 3 and suppressing the absorption of the pressure acting from the IC chip 3 on the first substrate 10 by the flexible substrate 5.

As shown in FIGS. 1 and 3, the plan view shape of the insulating support layer 61a is larger than that of the IC chip 3. When the perimeter of the insulating support layer 61a is defined as a perimeter $61a_1$, the perimeter $61a_1$ is located on the outside of a perimeter 3a of the IC chip 3 in the plan view. The insulating support layer 61a is formed so as to cover at least an area of an upper surface of the undercoat layer 6, the area corresponding to the area where the IC chip 3 is arranged.

Specifically, for example, the insulating support layer 61a is formed of an insulating material such as polysilicon. The material of the insulating support layer 61a is not limited to polysilicon. The support layer 61a may be formed of other materials than polysilicon as long as the hardness of the support layer 61a is greater than that of the flexible substrate 5.

The insulating support layer 61a in the non-display area E shown in FIG. 3 is formed in the same layer as, for example, the polysilicon semiconductor layer 11a in the display area D shown in FIG. 2. The forming place of the insulating support layer 61a is not limited to the same layer as the polysilicon semiconductor layer 11a. The insulating support layer 61a may be formed on other layers as long as the insulating support layer 61a is located between the flexible substrate 5 and the anisotropic conductive film 72.

Moreover, the insulating support layer 61a is preferably located outside the display area D in the plan view. As shown in FIG. 1, the insulating support layer 61a is specifically arranged in an area where the second substrate 50 is not arranged, in an area of the upper surface 10a of the first substrate 10, the area corresponding to the non-display area E in the plan view.

The insulating support layer 61a and an area of the undercoat layer 6 exposed from the insulating support layer 61a are covered with the first insulating film 61b. The first insulating film 61b is formed of, for example, the same material as that of the gate insulating layer 11b in the display area D, and formed in the same layer as the gate insulating layer 11b.

The metal support layer 61c is a support layer whose hardness is higher than that of the flexible substrate 5, for preventing the stress of the IC chip 3 from acting on the first substrate 10 around the IC chip 3 and suppressing the absorption of the pressure acting from the IC chip 3 on the first substrate 10 by the flexible substrate 5. The metal support layer 61c is formed so as to cover at least an area of an upper surface of the first insulating film 61b, the area corresponding to the area where the IC chip 3 is arranged. As shown in FIGS. 1 and 3, the plan view shape of the metal support layer 61c is larger than that of the IC chip 3, and a perimeter $61c_1$ of the metal support layer 61c is located on the outside of the perimeter 3a of the IC chip 3.

As shown in FIG. 1, the metal support layer 61c is located outside the display area D in the plan view. As shown in FIGS. 2 and 3, the metal support layer 61c is formed in, for example, the same layer as the gate electrode (wiring) 11c in the display area D. The metal support layer 61c is formed of, for example, MoW, which is the same material as that of the gate electrode 11c. The metal support layer 61c may be formed of other materials as long as the hardness of the metal support layer 61c is higher than that of the flexible substrate 5. The forming place of the metal support layer 61c is not limited to the same layer as the gate electrode 11c. The metal support layer 61c may be formed on other layers as long as the metal support layer 61c is located between the flexible substrate 5 and the anisotropic conductive film 72.

The metal support layer 61c and an area of the first insulating film 61b exposed from the metal support layer 61c are covered with the second insulating film 61d. The second insulating film 61d is formed of, for example, the same material as that of the second insulating film 11d in the display area D. The second insulating film 61d is formed in the same layer as the second insulating film 11d.

The second wirings 61e formed of, for example, aluminum are formed on the second insulating film 61d. The second wiring 61e is a wiring to transmit a video signal from the IC chip 3 to the source-drain electrode 11e in the display area D. The second wiring 61e is formed of, for example, the same material as that of the source-drain electrode 11e in the display area D. The second wiring 61e is formed in the same layer as the source-drain electrode 11e.

The second wirings 61e and an area of the second insulating film 61d exposed from the second wirings 61e are covered with the third insulating film 61f. The third insulating film 61f is formed of, for example, the same material as that of the third insulating film 11f in the display area D. The third insulating film 61f is formed in the same layer as the third insulating film 11f.

The terminal electrodes 71 each of which connects the IC chip 3 with the second wiring 61e via the anisotropic conductive film 72 are formed on the third insulating film 61f. The terminal electrode 71 is connected to the second wiring 61e via a contact hole 71a penetrating the third insulating film 61f. The terminal electrode 71 is formed of, for example, a light-transmissive material such as ITO. The terminal electrode 71 is formed in the same layer as the anode 32 in the display area D. Since the terminal electrode 71 is electrically conducted to the terminal 73 of the IC chip 3, the IC chip 3 and the thin film transistors 11 in the display area D are electrically connected with each other.

In the display device 1 in the embodiment, the support layer (at least one of the insulating support layer 61a and the metal support layer 61c) whose plan view shape is larger than that of the IC chip 3 and whose hardness is higher than that of the flexible substrate 5 is formed between the anisotropic conductive film 72 and the flexible substrate 5. Due to this, the absorption of the pressure acting from the IC chip 3 on the anisotropic conductive film 72 by the flexible substrate 5 is suppressed, compared with a display device not including the support layer.

For this reason, compared with a display device not having the configuration, the display device 1 in the embodiment can realize the stabilization of electrical conduction between the IC chip 3 and the thin film transistors 11 via the anisotropic conductive film 72. Due to this, an improvement in the reliability of the display device 1 can be realized.

Moreover, in the display device 1 in the embodiment, since the support layer is formed, the stress of the IC chip 3 caused by a temperature change is prevented from acting on the first substrate 10 around the IC chip 3, compared with a display device not having the configuration. For this reason, deformation such as crinkles is prevented from occurring in the surface of the first substrate 10 around the IC chip 3, so that an improvement in the reliability of the display device 1 can be realized.

Moreover, in the display device 1 in the embodiment, since the insulating support layer 61a is located outside the display area D in the plan view, it is possible to adopt a configuration in which the insulating support layer 61a is formed in the same layer as the gate insulating layer 11b in the display area D. For this reason, the display device 1 in the embodiment can obtain the above-described advantageous effects of the invention without increasing the thickness of the first substrate 10 in the display area D, compared with a display device not having the configuration.

Similarly, in the display device 1 in the embodiment, since the metal support layer 61c is located outside the display area D in the plan view, it is possible to adopt a configuration in which the metal support layer 61c is formed in the same layer as the gate electrode 11c in the display area D. For this reason, it is possible to obtain the above-described advantageous effects of the invention without increasing the thickness of the first substrate 10 in the display area D, compared with a display device not having the configuration.

Moreover, in the display device 1 in the embodiment, since the metal support layer 61c formed of metal is formed between the anisotropic conductive film 72 and the flexible substrate 5, the absorption of the pressure acting from the IC chip 3 on the anisotropic conductive film 72 by the flexible substrate 5 is suppressed, compared with a display device in which only the insulating support layer 61a is formed. For this reason, the display device 1 in the embodiment can realize an improvement in reliability.

Moreover, in the display device 1 in the embodiment, since the metal support layer 61c is formed in the area corresponding to the IC chip 3, the stress of the IC chip 3 is further prevented from acting on the first substrate 10 around the IC chip 3, compared with a display device in which only the insulating support layer 61a is formed. For this reason, the display device 1 in the embodiment can realize an improvement in reliability.

Moreover, in the display device 1 in the embodiment, since at least one of the support layers is the insulating support layer 61a formed of an insulating material, insulation between the terminal electrode 71 and the flexible substrate 5 is enhanced, compared with a display device not having the configuration. Due to this, the display device 1 in the embodiment can realize an improvement in reliability.

Figure 4:
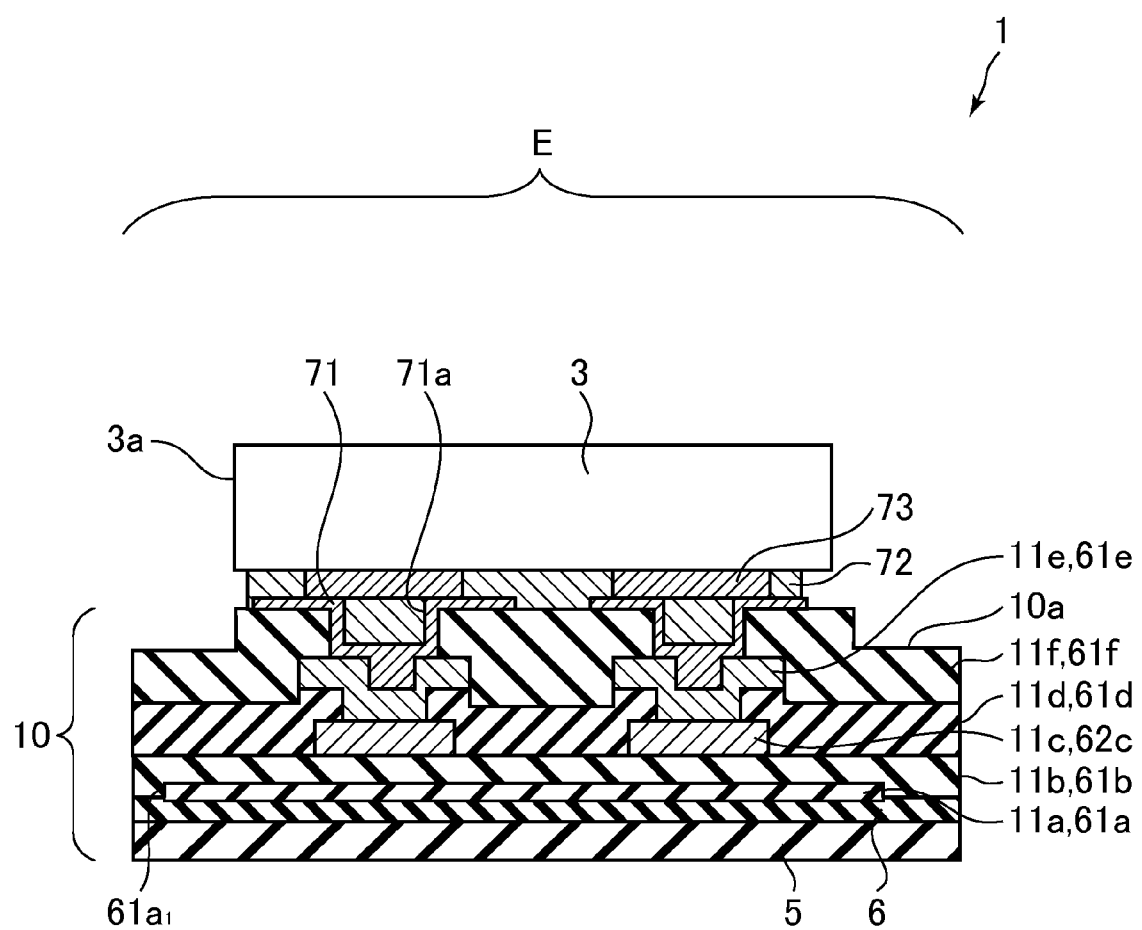
FIG. 4 is a schematic cross-sectional view showing a modified example of the display device shown in FIG. 1 in the same view as FIG. 3.

The display device 1 according to the embodiment has been described so far, but the configuration of the display device 1 is not limited to the embodiment described above. FIG. 4 is a schematic cross-sectional view showing a modified example of the display device 1 shown in FIG. 1 in the same view as FIG. 3. It is preferable that both the insulating support layer 61a and the metal support layer 61c are formed. However, as shown in FIG. 4 for example, it is sufficient that only one of them is formed.

When only the insulating support layer 61a is formed as a support layer as shown in the drawing, wiring lower portions 62c formed of the same material as that of the gate electrode 11c in the display area D may be formed in the same layer as the gate electrode 11c. When the display device 1 has the configuration described above, the wiring lower portion 62c is connected with the second wiring 61e and functions as a portion of the second wiring 61e.

In the display device 1, since only the insulating support layer 61a formed of an insulating material is formed as a support layer as described above, a short circuit between the terminal electrode 71 and the support layer is prevented, compared with a display device not having the configuration. Due to this, the display device 1 in the modified example can realize an improvement in reliability.

Moreover, the number of support layers is not limited to two. Three or more support layers may overlap as long as the hardness of the support layers is higher than that of the flexible substrate 5, the support layers are formed between the flexible substrate 5 and the anisotropic conductive film 72, and the plan view shape of the support layers is larger than that of the IC chip 3.

Next, a method of manufacturing the display device 1 according to an embodiment of the invention will be described with reference to the drawings. The method of manufacturing the display device 1 in the embodiment includes a step of forming the flexible substrate on a basic substrate 70, a step of forming one or more support layers on the flexible substrate 5 in the non-display area E, a step of forming the thin film transistors 11 and the organic electroluminescent light-emitting elements 30 on the flexible substrate 5 in the display area D, a step of arranging the counter substrate 50 on the display area D, a step of pressure bonding the IC chip 3 in the non-display area E, and a step of separating the flexible substrate 5 from the basic substrate 70.

Figure 5:
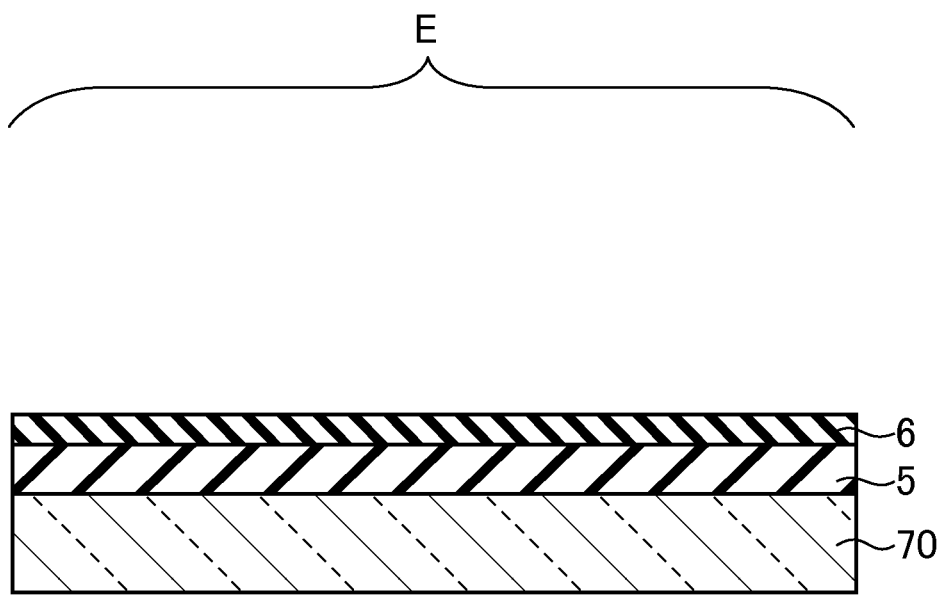
FIG. 5 is a schematic cross-sectional view showing the display device shown in FIG. 1 in the same view as FIG. 3, showing a method of manufacturing a display device according to an embodiment of the invention.

FIG. 5 is a schematic cross-sectional view showing the display device 1 shown in FIG. 1 in the same view as FIG. 3, showing the method of manufacturing the display device 1 according to the embodiment of the invention. First, the flexible substrate 5 that is formed of, for example, polyimide and segmented into the display area D and the non-display area E outside the display area D is formed on the basic substrate 70. The basic substrate 70 is a substrate used as the base of the flexible substrate 5, for which, for example, a glass substrate is used. The basic substrate 70 is not limited to a glass substrate, and a substrate formed of other materials may be used as long as the substrate has strength enough to function as the base of the flexible substrate 5. Next, the undercoat layer 6 formed of an insulating material is stacked on the flexible substrate 5.

Figure 6:
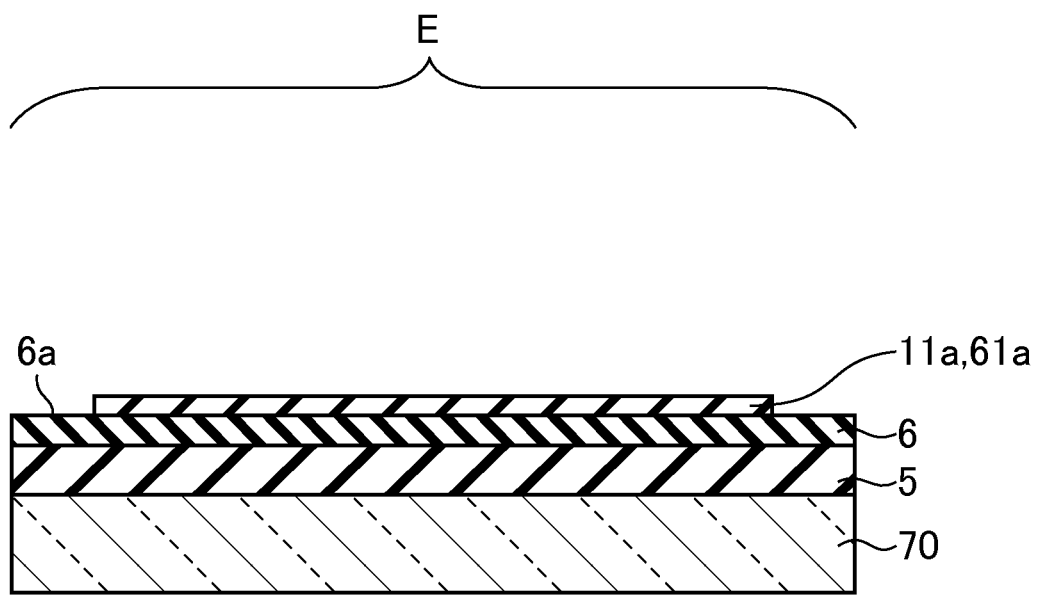
FIG. 6 is a schematic cross-sectional view showing the display device shown in FIG. 1 in the same view as FIG. 3, showing the method of manufacturing the display device according to the embodiment of the invention.

FIG. 6 is a schematic cross-sectional view showing the display device 1 shown in FIG. 1 in the same view as FIG. 3, showing the method of manufacturing the display device 1 according to the embodiment of the invention. Next, a layer formed of, for example, an insulating material such as polysilicon is formed so as to cover an upper surface of the undercoat layer 6 in the non-display area E. In this case, a layer formed of an insulating material may be formed, not only in the non-display area E, but also similarly in the display area D. The insulating material is not limited to polysilicon, and other materials may be used as long as the hardness is higher than that of the flexible substrate 5.

Next, the layer formed of an insulating material is patterned to form the insulating support layer 61a as a support layer whose hardness is higher than that of the flexible substrate 5 in the non-display area E. In the patterning, as shown in FIGS. 1 and 6, the forming range of the insulating support layer 61a is adjusted such that the insulating support layer 61a is located outside the display area D in the plan view.

In the step of patterning the insulating support layer 61a, the polysilicon semiconductor layer 11a shown in FIG. 2 may be formed in the display area D in the same layer as the insulating support layer 61a in the non-display area E by simultaneously patterning the layer formed of an insulating material also in the display area D.

Figure 7:
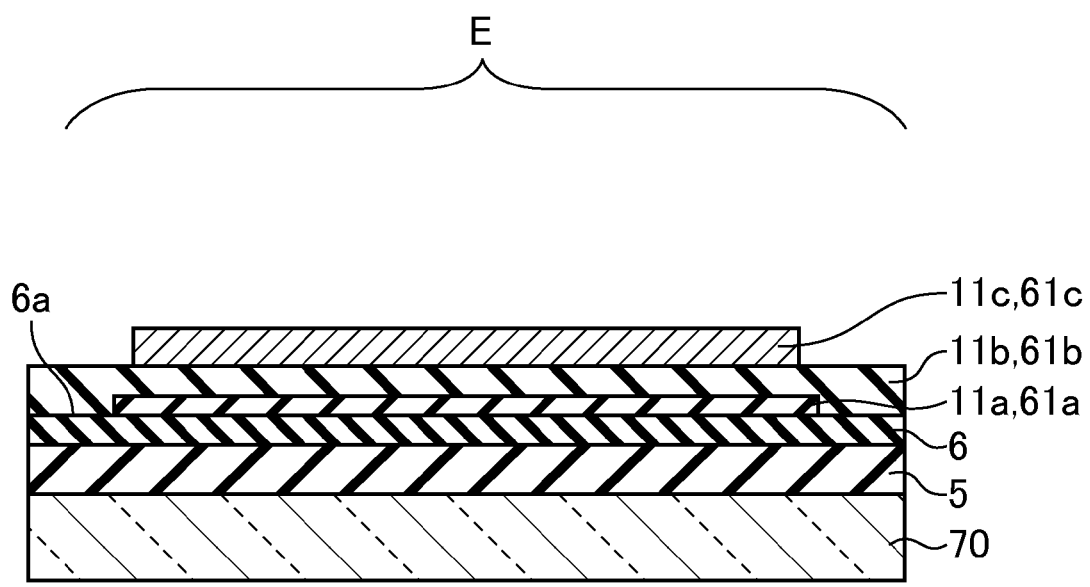
FIG. 7 is a schematic cross-sectional view showing the display device shown in FIG. 1 in the same view as FIG. 3, showing the method of manufacturing the display device according to the embodiment of the invention.

FIG. 7 is a schematic cross-sectional view showing the display device 1 shown in FIG. 1 in the same view as FIG. 3, showing the method of manufacturing the display device 1 according to the embodiment of the invention. Next, the first insulating film 61b formed of an insulating material is formed so as to cover the insulating support layer 61a and the undercoat layer 6 exposed from the insulating support layer 61a. In the step, the gate insulating layer 11b formed of the same material as that of the first insulating film 61b may be formed also on the undercoat layer 6 in the display area D shown in FIG. 2.

Next, a metal film such as of, for example, MoW is formed so as to cover the first insulating film 61b in the non-display area E. In the step, a metal film may be formed also on the gate insulating layer 11b in the display area D shown in FIG. 2. The material of the metal film is not limited to MoW, and other materials may be used as long as the hardness of the material is higher than that of the flexible substrate 5.

Figure 8:
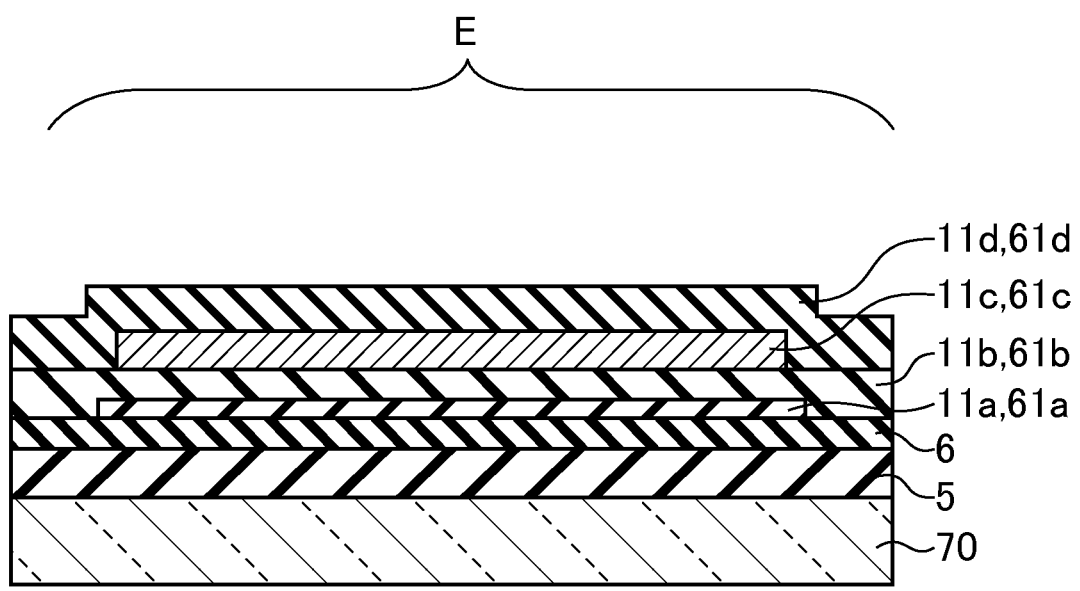
FIG. 8 is a schematic cross-sectional view showing the display device shown in FIG. 1 in the same view as FIG. 3, showing the method of manufacturing the display device according to the embodiment of the invention.

FIG. 8 is a schematic cross-sectional view showing the display device 1 shown in FIG. 1 in the same view as FIG. 3, showing the method of manufacturing the display device 1 according to the embodiment of the invention. Next, the metal film formed on the first insulating film 61b is patterned to form the metal support layer 61c as a support layer whose hardness is higher than that of the flexible substrate 5 in the non-display area E. In the patterning, as shown in FIGS. 1 and 8, the forming range of the metal support layer 61c is adjusted such that the metal support layer 61c is located outside the display area D in the plan view.

In the step of forming the metal support layer 61c, the gate electrode (wiring) 11c shown in FIG. 2 may be formed in the same layer as the metal support layer 61c in the display area D by simultaneously patterning the metal film also in the display area D.

Next, the second insulating film 61d formed of an insulating material is formed so as to cover the metal support layer 61c and the first insulating film 61b exposed from the metal support layer 61c. In this case, the second insulating film. 11d in the same layer as the second insulating film 61d in the non-display area E may be formed in the display area D by forming an insulating material so as to cover the gate electrode (wiring) 11c also in the display area D.

Figure 9:
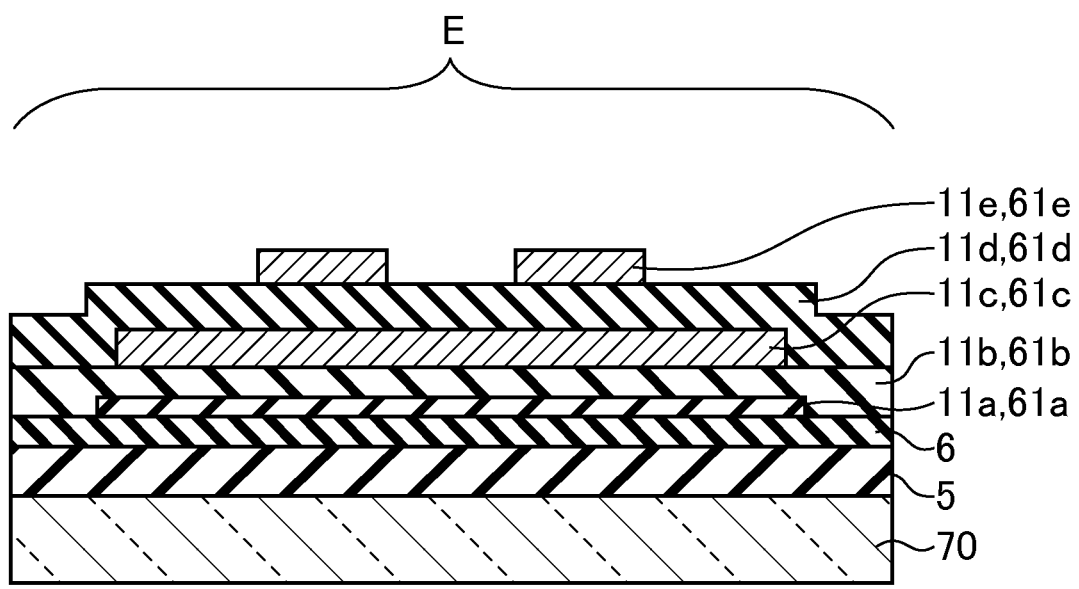
FIG. 9 is a schematic cross-sectional view showing the display device shown in FIG. 1 in the same view as FIG. 3, showing the method of manufacturing the display device according to the embodiment of the invention.

Next, an aluminum film, for example, is deposited so as to cover the second insulating film 61d. FIG. 9 is a schematic cross-sectional view showing the display device 1 shown in FIG. 1 in the same view as FIG. 3, showing the method of manufacturing the display device 1 according to the embodiment of the invention. Next, the aluminum film is patterned to thereby form the second wirings 61e in an area corresponding to the insulating support layer 61a and the metal support layer 61c. The material of the second wiring 61e is not limited to aluminum, and other materials may be used.

Moreover, in the step, the source-drain electrode 11e formed of the same material as that of the second wiring 61e may be formed by patterning an aluminum film also in the same layer as the second wiring 61e in the display area D.

Figure 10:
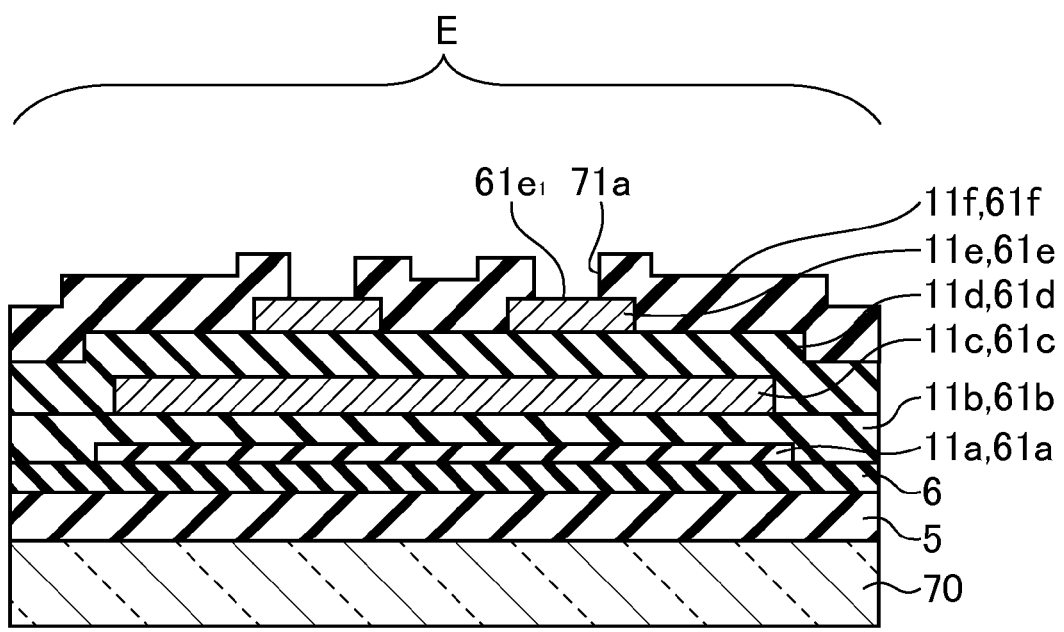
FIG. 10 is a schematic cross-sectional view showing the display device shown in FIG. 1 in the same view as FIG. 3, showing the method of manufacturing the display device according to the embodiment of the invention.

FIG. 10 is a schematic cross-sectional view showing the display device 1 shown in FIG. 1 in the same view as FIG. 3, showing the method of manufacturing the display device 1 according to the embodiment of the invention. Next, the third insulating film 61f formed of an insulating material is formed so as to cover the second wirings 61e and exposed areas of the second insulating film 61d.

In the step of forming the third insulating film 61f, the third insulating film 11f in the same layer as the third insulating film 61f in the non-display area E may be formed by similarly stacking an insulating material also in the display area D. Due to this, the thin film transistor 11 shown in FIG. 2 is formed on the display area D of the flexible substrate 5.

Next, as shown in FIG. 10, the contact holes 71a through each of which an upper surface 61e₁ of the second wiring 61e is exposed is formed to penetrate the third insulating film 61f in the non-display area E.

Figure 11:
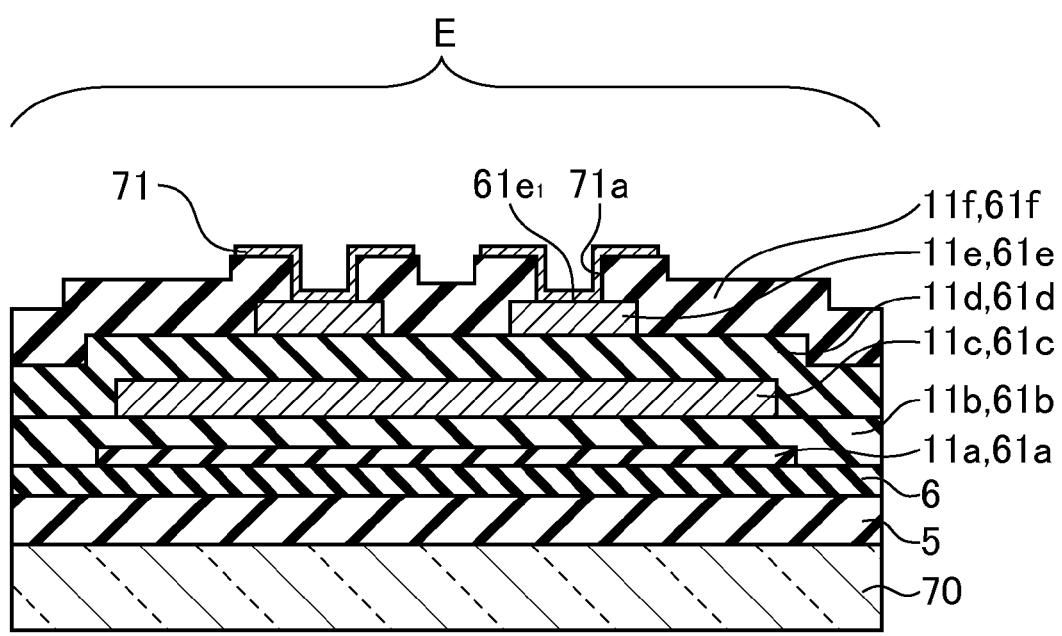
FIG. 11 is a schematic cross-sectional view showing the display device shown in FIG. 1 in the same view as FIG. 3, showing the method of manufacturing the display device according to the embodiment of the invention.

FIG. 11 is a schematic cross-sectional view showing the display device 1 shown in FIG. 1 in the same view as FIG. 3, showing the method of manufacturing the display device 1 according to the embodiment of the invention. Next, a light-transmitting film formed of a light-transmissive material such as ITO is coated so as to cover an upper surface of the third insulating film 61f and the insides of the contact holes 71a. Next, the light-transmitting film is patterned to thereby form the terminal electrodes 71 covering the insides of the contact holes 71a.

In the step of forming the terminal electrode 71, the anode 32 may be formed by similarly forming and patterning a light-transmitting film also in the display area D.

Thereafter, as shown in FIG. 2, by forming the pixel separation films 14, the organic electroluminescent light-emitting elements 30, and the sealing film 40 on the display area D of the flexible substrate 5, the first substrate 10 including the flexible substrate 5, the undercoat layer 6, the circuit layer 12 including the thin film transistors 11, the planarization film 13, the organic electroluminescent light-emitting elements 30, and the sealing film 40 is formed.

Next, the second substrate (counter substrate) 50 is arranged so as to face an upper surface of the display area D of the first substrate 10 via the filler 45.

Next, as shown in FIGS. 1 and 3, the IC chip 3 whose plan view shape is smaller than those of the support layers is pressure bonded on the non-display area E of the support layers (the insulating support layer 61a and the metal support layer 61c) via the anisotropic conductive film 72 so as to be located on the inside of the support layers in the plan view.

Specifically, the anisotropic conductive film 72 is first attached on the terminal electrodes 71. Next, the IC chip 3 including the terminals 73 is arranged such that the terminal 73 is located on the terminal electrode 71 via the anisotropic conductive film 72. Next, by applying pressure from above the IC chip 3 while heating, the terminals 73 of the IC chip 3 are pressure bonded to the terminal electrodes 71 via the anisotropic conductive film 72. Due to this, the IC chip 3 and the thin film transistors 11 in the display area D are electrically conducted to each other.

Thereafter, by separating the flexible substrate 5 from the basic substrate 70, the display device 1 shown in FIGS. 1 to 3 is formed.

In the method of manufacturing the display device 1 in the embodiment, at least one of the insulating support layer 61a and the metal support layer 61c is formed, between the anisotropic conductive film 72 and the flexible substrate 5, as a support layer whose plan view shape is larger than that of the IC chip 3 and whose hardness is higher than that of the flexible substrate 5. Therefore, compared with a method of manufacturing a display device not having the configuration, the absorption of the pressure acting on the anisotropic conductive film 72 when pressure bonding the IC chip 3 by the flexible substrate 5 is suppressed. For this reason, the IC chip 3 and the thin film transistor 11 can be electrically conducted stably to each other. Due to this, the display device 1 with high reliability can be manufactured.

Moreover, in the method of manufacturing the display device 1 in the embodiment, since the insulating support layer 61a, for example, is formed as a support layer, stress caused by heating and cooling when pressure bonding the IC chip 3 is prevented from acting on the first substrate 10 around the IC chip 3, compared with a method of manufacturing a display device not having the configuration. For this reason, the IC chip 3 and the first substrate 10 can be bonded to each other without the occurrence of deformation in the surface of the first substrate 10 around the IC chip 3.

Moreover, in the method of manufacturing the display device 1 in the embodiment, since the insulating support layer 61a formed of an insulating material is formed as a support layer, insulation between the terminal electrode 71 and the flexible substrate 5 can be enhanced compared with a method of manufacturing a display device not having the configuration, so that the display device 1 with high reliability can be manufactured.

Moreover, in the method of manufacturing the display device 1 in the embodiment, since the support layer is formed so as to be located outside the display area D in the plan view, the insulating support layer 61a can be formed in the same layer as the gate insulating layer 11b in the display area D. For this reason, the above-described advantageous effects of the invention can be obtained without increasing the thickness of the first substrate 10 in the display area D, compared with a method of manufacturing a display device not having the configuration.

Moreover, in the method of manufacturing the display device 1 in the embodiment, since the metal support layer 61c formed of metal is formed as one of the support layers between the anisotropic conductive film 72 and the flexible substrate 5, the absorption of the pressure acting from the IC chip 3 on the anisotropic conductive film 72 by the flexible substrate 5 is suppressed, compared with a display device not having the configuration. For this reason, an improvement in the reliability of the display device 1 can be realized.

Moreover, since the metal support layer 61c is formed in the same layer as the gate electrode (wiring) 11c of the thin film transistor 11 in the display area D, the above-described advantageous effects of the invention can be obtained without increasing the thickness of the first substrate 10 in the display area D, compared with a method of manufacturing a display device not having the configuration.

Moreover, in the method of manufacturing the display device 1 in the embodiment, since both the insulating support layer 61a and the metal support layer 61c are formed as support layers, the occurrence of deformation in the surface of the first substrate 10 when pressure bonding the IC chip 3 and a failure of electrical conduction between the IC chip 3 and the thin film transistor 11 can be suppressed, compared with a manufacturing method in which only any one of the support layers is formed.

The embodiments of the invention have been described so far, but the invention is not limited to the embodiments described above. For example, the configurations described in the embodiments described above may be replaced with substantially the same configuration, a configuration providing the same operational effect, or a configuration capable of achieving the same object.

Figure 12:
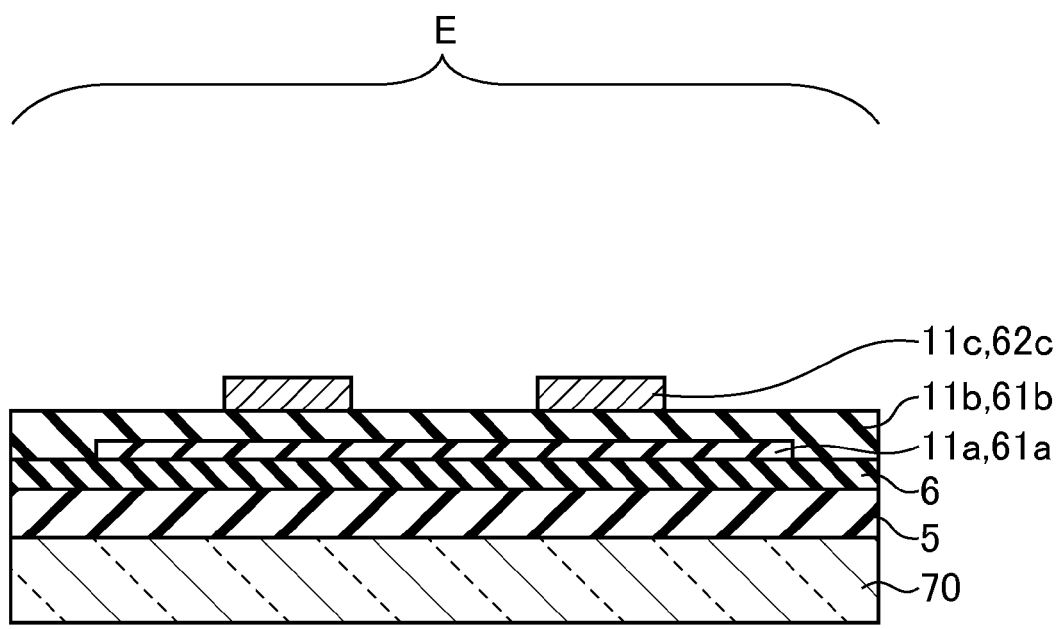
FIG. 12 is a schematic cross-sectional view showing the display device shown in FIG. 4 in the same view as FIG. 3, showing the method of manufacturing the display device according to the embodiment of the invention.

FIG. 12 is a schematic cross-sectional view showing the display device 1 shown in FIG. 4 in the same view as FIG. 3, showing a modified example of the method of manufacturing the display device according to the embodiment of the invention. For example, as shown in the drawing, the wiring lower portions 62c may be formed, instead of the metal support layer 61c, in the same layer as the gate electrode 11c in the display area D. Since only the insulating support layer 61a is formed as a support layer as described above, it is possible to manufacture the display device 1 with high reliability that can prevent a short circuit between the terminal electrode 71 and the support layer, compared with a method of manufacturing a display device not having the configuration.

The number of support layers to be formed is not limited to two. Three or more support layers may be formed as long as the hardness is higher than that of the flexible substrate 5, the plan view shape is larger than that of the IC chip 3, and the support layers are formed between the flexible substrate 5 and the anisotropic conductive film 72.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a first substrate that includes a flexible substrate, which is segmented into a display area and a non-display area outside the display area, and includes a thin film transistor and a display element formed on the display area of the flexible substrate;
   a metal support layer over the flexible substrate in the non-display area without extending to the display area and without directly contacting any electrodes, the metal support layer being harder than the flexible substrate;
   a first insulating film between the metal support layer and the flexible substrate;
   a second insulating film with the metal support layer interposed between the first insulating film and the second insulating film;
   a second substrate that is arranged so as to face an upper surface of the display area of the first substrate; and
   an IC chip that is mounted on the first substrate, the IC chip entirely overlapping with an area where the metal support layer is continuously provided in a plan view, wherein,
   the thin film transistor has a gate electrode, source and drain electrodes, and a polysilicon semiconductor layer,
   the first insulating film and the second insulating film extend to the non-display area with the gate electrode interposed between the first insulating film and the second insulating film, the metal support layer lies between the flexible substrate and the IC chip, and the metal support layer is larger than the IC chip to encompass the IC chip in a plan view, and
   the metal support layer is formed in the same layer as a wiring of the thin film transistor.

2. The display device according to claim 1, further comprising another insulating film formed in the non-display area and closer to a side of the flexible substrate than the metal support layer.

3. The display device according to claim 1, wherein the first insulating film is formed on a polysilicon layer in the non-display area.

4. The display device according to claim 1, wherein the first insulating film is formed in the non-display area in the same layer as a gate insulating film of the thin film transistor.

5. The display device according to claim 1, wherein the polysilicon semiconductor layer lies between the first insulating film and the flexible substrate.

6. A method of manufacturing a display device comprising the steps of:
- forming, on a basic substrate, a flexible substrate that is segmented into a display area and a non-display area outside the display area;
- forming a first insulating film over the flexible substrate;
- forming, over the first insulating film, in the non-display area without extending to the display area and without directly contacting any electrodes, a metal support layer whose hardness is higher than that of the flexible substrate;
- forming a gate electrode of a thin film transistor over the first insulating film in the display area;
- forming a second insulating film over the metal support layer and the gate electrode;
- forming, on the display area of the flexible substrate, a display element;
- arranging a counter substrate so as to face the display area;
- bonding, on the non-display area of the metal support layer, an IC chip whose plan view shape is smaller than that of the metal support layer so as to be located to entirely overlap with an area where the metal support layer is continuously provided in a plan view; and
- separating the flexible substrate from the basic substrate, wherein
- the metal support layer is interposed between the first insulating film and the second insulating film,
- the gate electrode is interposed between the first insulating film and the second insulating film, and
- the metal support layer is formed in the same layer as a wiring of the thin film transistor.

7. The method of manufacturing a display device according to claim 6, further comprising
forming the first insulating film on a polysilicon layer in the non-display area before forming the metal support layer.

8. The method of manufacturing a display device according to claim 6, further comprising
forming a polysilicon semiconductor layer of the thin film transistor before forming the first insulating film and the gate electrode,
wherein the first insulating film is interposed between the polysilicon semiconductor layer and the gate electrode.

* * * * *